(12) United States Patent
Endo

(10) Patent No.: US 6,651,022 B2
(45) Date of Patent: Nov. 18, 2003

(54) SEMICONDUCTOR DEVICE CAPABLE OF TEST MODE OPERATION

(75) Inventor: Shunsuke Endo, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 147 days.

(21) Appl. No.: 09/906,671

(22) Filed: Jul. 18, 2001

(65) Prior Publication Data

US 2002/0069026 A1 Jun. 6, 2002

(30) Foreign Application Priority Data

Dec. 6, 2000 (JP) ........................................ 2000-371417

(51) Int. Cl.[7] ............................................... G06F 3/05
(52) U.S. Cl. ........................ 702/117; 702/107; 702/118; 702/120
(58) Field of Search ............................... 702/57, 64, 65, 702/107, 117, 118, 120, 182, 189; 435/6; 711/108, 158; 703/17; 710/305; 365/233; 327/144, 154; 324/713; 714/33

(56) References Cited

U.S. PATENT DOCUMENTS

| | | | | |
|---|---|---|---|---|
| 5,894,423 A | * | 4/1999 | Ling et al. | 364/528.28 |
| 6,122,704 A | * | 9/2000 | Hass et al. | 711/100 |
| 6,201,423 B1 | * | 3/2001 | Taguchi et al. | 327/141 |
| 6,438,462 B1 | * | 8/2002 | Hanf et al. | 700/297 |

* cited by examiner

Primary Examiner—Marc S. Hoff
Assistant Examiner—Felix Suarez
(74) Attorney, Agent, or Firm—McDermott, Will & Emery

(57) ABSTRACT

An output signal from a level detection circuit that detects a super VIH (normal logical high voltage level) condition is set to a valid state or to an invalid state by a force circuit and is applied to a test control circuit. A test mode with the super VIH (SVIH) condition can be entered efficiently, while the possibility of an erroneous entry on the user side and constraints of the test apparatus upon serial test entry are suppressed.

15 Claims, 7 Drawing Sheets

SEMICONDUCTOR DEVICE CAPABLE OF TEST MODE OPERATION

BACKGROUND OF THE INVENTION

1. Field of the Invention

The present invention relates to a semiconductor device, and particularly, to a circuit for setting, to a test mode, a semiconductor circuit device capable of a test mode operation. More specifically, the present invention is related to a test mode setting circuit of such a semiconductor memory device.

2. Description of the Background Art

In a semiconductor integrated circuit device such as a dynamic random access memory (DRAM), in general, in the manufacturing process, tests are performed for checking whether normal operation can be implemented or not. Such tests include a screening test (burn-in test) for revealing a latent defect, a margin test for detecting margin defect of voltage or signal timing, and others. In such tests, a special chip operation (operation of a semiconductor integrated circuit device) that is not used in an actual use is performed, such that the semiconductor integrated circuit device is operated under a condition of high temperature and high voltage, or at a timing different from a normal operating timing. Such special chip operation is enabled by setting a test mode.

FIG. 8 is a schematic representation of an overall arrangement of a DRAM as an example of a conventional semiconductor integrated circuit device. In FIG. 8, a DRAM 100 includes a memory cell array 101 having memory cells MC arranged in a matrix of rows and columns, a word line WL provided corresponding to a row of memory cells, and a bit line BL disposed corresponding to a column of memory cells MC; a row decoder 102 for driving, to a selected state, a word line corresponding to an addressed row in memory cell array 101 according to an applied X signal; a sense amplifier 103 for sensing, amplifying and latching data of memory cells connected to a selected row; a column decoder 104 for selecting an addressed column of memory cell array 101 according to an applied Y signal.

DRAM 100 further includes a /RAS buffer 105 for taking in an externally applied row address strobe signal /RAS in synchronization with an internal clock signal CLK to generate internal signals ZRASE and int.RAS; a /CAS buffer 106 for taking in a column address strobe signal /CAS applied from an outside in synchronization with internal clock signal CLK to generate an internal column address strobe signal int.CAS; a /WE buffer 107 for taking in a write enable signal /WE applied from an outside in synchronization with internal clock signal CLK to generate an internal write enable signal int.WE; a row address buffer 108 for taking in an externally applied address in synchronization with an internal clock signal; a column address buffer 109 for taking in an externally applied address in synchronization with the internal clock signal; a row-related control circuit 110 for generating an X address according to an address signal from row address buffer 108 in response to activation of a row-related activation signal ZRASE from /RAS buffer 105; a column-related control circuit 111 for generating a Y address according to an address signal from column address buffer 109 upon activation of a column select activation signal (only the path is shown) from /CAS buffer 106; a write control circuit 112 for generating a write/read control signal according to a write/read instruction signal (only the path is shown) from /WE buffer 107; and an input/output circuit 113 for inputting and outputting data between an internal data line I/O and the outside according to the write/read control signal from write control circuit 112.

The column select activation signal is generated according to internal column address signal int.CAS, while the write/read control signal is generated according to internal write enable signal /WE.

A column select circuit that connects, to an internal data line I/O, a bit line corresponding to a selected column of memory cell array 101 according to a column select signal from column decoder 104 is arranged adjacent to sense amplifier 103. The column select circuit, however, is not shown in the drawing for simplicity purpose.

Input/output circuit 113 includes a preamplifier 113a for amplifying data on internal data line I/O when activated, an output buffer 113b for buffering internal data amplified by preamplifier 113a to generate external read data DQ in a data read mode, an input buffer 113d for buffering write data DQ received from an outside in data write operation, and a write driver 113c activated according to the write/read control signal from write control circuit 112 for driving an internal data line I/O according to write data from input buffer 113d.

DRAM 100 further includes an internal voltage generating circuit 114 for generating internal voltages Vdd, Vbb, and Vcp according to an externally applied external power-supply voltage or an internally generated internal power-supply voltage, a clock buffer 115 for buffering a clock signal ext.CLK applied from an outside to generate an internal clock signal CLK, and a mode setting circuit 120 for generating a mode setting signal TM for designating a specific operation mode according to internal control signals int.RAS, int.CAS, and int.WE from buffers 105 to 107 and an external address signal bit.

Voltage Vdd is an internal power-supply voltage generated by down-converting an external power-supply voltage in internal voltage generating circuit 114. Voltage Vbb is a negative voltage generated through a charge pump operation in internal voltage generating circuit 114, and is applied to a substrate region of memory cell array 101 and other. Voltage Vcp is a voltage applied to a cell plate of a capacitor included in a memory cell MC. Internal voltage generating circuit 114 further generates a bit line equalizing voltage Vb1 for precharging a bit line BL in a standby cycle, a high voltage Vpp transmitted on a selected word line WL, and such.

Mode setting circuit 120 determines that a special mode is designated when internal control signals int.RAS, int.CAS, and int.WE and a specific external address signal bit satisfy a prescribed condition, and generates a mode setting signal TM for performing a designated mode. Mode setting circuit 120 contains a mode register for setting an operation condition (burst length, CAS latency, and the like) of DRAM 100.

In DRAM 100 as shown in FIG. 8, with mode setting circuit 120, a burn-in test mode is set up when a burn-in test which is one of the screening tests is to be performed. In the burn-in test mode, the voltage levels of internal power-supply voltage Vdd, a cell plate voltage Vcp, a high voltage Vpp (not shown), a bit line precharge voltage Vb1 and other from internal voltage generating circuit 114 are set higher than the respective voltage levels under normal operation conditions, in order to accelerate voltage stress. Moreover, in such burn-in test, more word lines than those selected in a normal operation mode are selected simultaneously in memory cell array 101.

Setting of these voltage conditions and setting of selecting conditions of word lines are performed individually using a specific set of externally applied address bits (address key).

FIG. 9 is a schematic representation of an arrangement of mode setting circuit 120 shown in FIG. 8. In FIG. 9, mode setting circuit 120 includes a level detection circuit 121 for detecting whether a signal BA0 of a specific node is set to a prescribed voltage condition; an MRS detection circuit 122 for detecting whether internal control signals int.RAS, int.CAS, int.WE satisfy a predetermined condition such as a WCBR (WE, CAS before RAS) condition; an address key detection circuit 123 for detecting whether a prescribed set of externally applied address signal bits A0 to An satisfy a prescribed state; and a mode detection circuit 124 for activating a test mode instruction signal TEM when an output signal BA0S from level detection circuit 121, an output signal MRS from MRS detection circuit 122, an address key detection signal ADK from address key detection circuit 123, and a specific bit signal bit A7 are all activated.

Level detection circuit 121 drives its output signal BA0S to the active state when a super VIH condition (SVIH condition) is satisfied in which, for example, a bank address signal bit BA0 is set at a higher voltage level than a normal logic high or H level (external power-supply voltage level) supplied during normal operation. Here, in FIG. 8, memory cell array 101 is divided into a plurality of banks that can be activated/inactivated for a row select operation independently from each other, and bank address signal bit BA0 is applied externally to specify one of these banks.

MRS detection circuit 122 determines that the WCBR condition is satisfied, or determines that a mode register set command is applied, when internal control signals int.RAS, int.CAS, and int.WE are all in the active state of the H level at the rising edge (or falling edge) of internal clock signal CLK, and drives a mode register set command detection signal MRS to the active state.

Address key detection circuit 123 receives predetermined address signal bits of the address bits A0 to An, and activates, when the received address signal bits are set to prescribed logic states, address key detection signal ADK to the active state. Mode detection circuit 124 is formed by an AND circuit, for example, and activates test mode instruction signal TEM when these signals BA0S, MRS, ADK, and A7 are all activated.

An address key is predetermined for each test operation mode. Thus, address keys differ for each of the test operation modes, such as a test operation mode in which internal power-supply voltage Vdd is boosted to a higher voltage level, a test operation mode in which a voltage level of high voltage Vpp transmitted on a word line is raised to a further higher level, a test operation mode in which a voltage level of cell plate voltage Vcp is raised to a level higher than the normal operation level, and a test operation mode in which the number of word lines selected simultaneously is increased and other test modes. Consequently, when a test mode is entered and a test is to be performed with a plurality of test conditions set concurrently, there is a need to set the address keys according to separate test operation modes to designate these test operation modes sequentially.

FIG. 10 is a diagram representing an example of a sequence of test operation mode entry in a conventional DRAM. Referring to FIG. 10, a test mode entry operation is first performed in order to set the DRAM into a test mode. Upon the test mode entry operation, as a command applied externally, mode register set command MRS is supplied together with a specific address signal bit A7, and a bank address signal bit BA0 is set to the super VIH (SVIH) condition, and an address key is set to a specific address key KY0. According to this test mode entry command, a test mode instruction signal TE is activated, and the DRAM is set to a state in which it can accept test mode instruction signals for designating separate test operation modes, to operate in various test operation modes for testing.

Thereafter, individual test operation mode for performing an actual test is designated. First, in order to set a test A, mode register set command MRS including address signal bit A7, and an address key KYA and bank address signal bit BA0 set to the super VIH (SVIH) condition are applied. As a result, output signals from the detection circuits 121 to 123 shown in FIG. 9 are all activated, and a test mode detection signal TEMA for enabling a test mode A from mode detection circuit 124 attains the active state. Test A is executed in this state.

Now, it is supposed that test A is a test operation mode in which an internal power-supply voltage is raised to a higher level than a normal voltage level in a normal operation. In this state, if a test B is to be set next, mode register set command MRS including address signal bit A7, bank address signal bit BA0 set to the super VIH (SVIH) condition, and an address key KYB are applied simultaneously. Consequently, a test mode designating signal TMB for enabling test B from mode detection circuit 124 provided corresponding to a test operation mode B attains the active state. As a result, in a test mode, both test A and test B can be executed concurrently.

Therefore, when the DRAM is to be operated under a plurality of test conditions, the test mode entry operation is performed, and thereafter, test A, test B, and other(s) are sequentially and serially designated.

Such test mode is an operation mode that a manufacturer performs in order to guarantee reliability of the products, and that a user never uses the test mode. In addition, in a test operation mode, a special operation is executed that is not used during a normal operation mode. Thus, for setting of a test mode, a manufacturer requires conditions other than normal operation conditions, such as a mode register set command including a specific address signal bit, an address key, a super VIH (SVIH), and others as described above so as to prevent the DRAM from erroneously entering a test mode while the DRAM is used by a user.

As described above, in a test mode, application of a high voltage referred to as a super VIH (SVIH) becomes necessary for entry into each test operation mode. Level detection circuit 121 in FIG. 9 discriminates the super VIH (SVIH) condition using the internal voltage as a reference. For example, bank address signal bit BA0 applied externally is down-converted using a diode element, for example, and the voltage level is determined as being at the H level, or at a logic low or L level. Thus, as shown in FIG. 10, when test A is entered and the internal voltage is set to a high voltage, and then test B is to be entered, there is a need to make the voltage level of a specific signal (bank address signal bit) BA0 sufficiently higher than the internal voltage in order to satisfy the super VIH condition. For example, in FIG. 11, a case is assumed in which the voltage level of internal power-supply voltage Vdd is set, for example, to 5.0 V when test A is entered, with the condition that the super VIH condition is a high voltage Va higher than a power-supply voltage Vdd of 3.3 V, for example, during a normal operation. If an inverter circuit is utilized for detection of the super VIH condition, an input logical threshold voltage of the inverter circuit also rises in proportion to internal power-supply voltage Vdd. In this case, the following relation need be satisfied:

$SVIH-Vdrop>Vdd/2$=input logical threshold voltage of the inverter.

Here, Vdrop indicates a voltage drop of a specific signal (bank address signal bit) BA0 applied externally in the level detection circuit, and SVIH indicates a voltage of super VIH condition. For an accurate detection of the SVIH condition, the following relation is required:

$SVIH>Vdrop+Vdd.$

Thus, if SVIH is at 6.3 V when power-supply voltage Vdd is at 3.3 V, voltage SVIH need be set to 8 V when power-supply voltage Vdd rises to 5 V.

Thus, when the voltage level of internal power-supply voltage Vdd is made higher, the voltage level of voltage SVIH satisfying the super VIH condition also becomes higher accordingly. In addition, in a case where the super VIH condition is set to twice the internal power-supply voltage Vdd using a voltage dividing circuit and the like, the voltage Va in FIG. 11 becomes 2·Vdd. If the voltage level of this internal power-supply voltage Vdd is set in a test operation mode to 1.5 times the voltage level of the normal operation, for example, a voltage of 2·Vdd=3·Vdd (Va) need be applied as the voltage Vb in order to implement the voltage SVIH that satisfy the super VIH condition at this time. In other words, there arises a need to apply voltage Vb of the voltage level that is three times the voltage Va that satisfies the super VIH condition in a normal operation mode.

The specific signal (bank address signal) is also applied to other buffer circuits (row address buffer 108 and column address buffer 109) as shown in FIG. 8, and therefore, the reliability of these buffer circuits would be lost when a voltage of such a high level is applied. Thus, in order to avoid such a risk, such special entry operations are conventionally performed as entering into a test mode without an application of a voltage satisfying the super VIH condition (without requiring the super VIH condition), and entering into the test operation mode with an internal voltage temporarily lowered, and then the internal voltage is raised again after the entry into the test operation mode.

When the super VIH condition is not required, however, there is a greater possibility of the DRAM erroneously entering into a test mode during the practical, actual use by a user. Moreover, in a case where a test mode is entered into by lowering an internal voltage temporarily to satisfy the super VIH condition, it takes a long time for the internal voltage to rise to the original level again after it has been lowered, so that the test time becomes longer, resulting in a degraded test efficiency.

SUMMARY OF THE INVENTION

An object of the present invention is to provide a semiconductor device that is capable of performing a test efficiently while suppressing the possibility of an erroneous entry into a test mode on a user side.

Another object of the present invention is to provide a semiconductor device capable of entering into a desired test operation mode with accuracy without degrading test efficiency, while suppressing the possibility of an erroneous entry into a test mode on the user side.

In brief, according to the present invention, a prescribed voltage condition required for an entry into a test operation mode is set selectively to a valid or invalid state.

By forcibly satisfying the state in which a prescribed voltage condition such as a super VIH, the need of setting a specific voltage condition such as super VIH under a special voltage condition such as under a high voltage condition and the need of changing an internal voltage and others can be eliminated, so that a prescribed operation such as a test can be performed by efficiently entering into a specific designated operation mode such as a test mode. In a non-forced state, the specific voltage condition becomes necessary, so that a specific voltage condition for entering into a specific operation mode such as a test mode would be required, which prevents an erroneous entry into an erroneous specific operation mode by a user.

In addition, when the test mode entry is performed in a serial access sequence, by making a specific voltage condition programmable for each test mode, a test mode entry can be effected without setting a specific voltage condition such as a super VIH in a test mode so that a successful entry into a test mode can be ensured to perform a test efficiently, while an erroneous entry into a test mode on the user side can be prevented.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
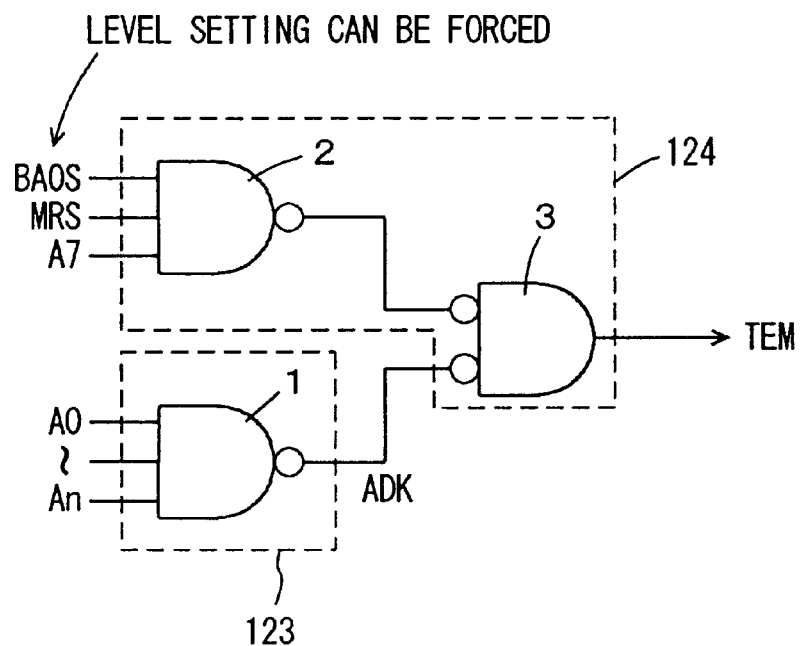
FIG. 1 is a diagram representing an example of an arrangement of a test mode control circuit according to the present invention.

FIG. 1 is a diagram representing an example of an arrangement of a test mode detection circuit according to the first embodiment of the present invention. As shown in FIG.

Figure 9:
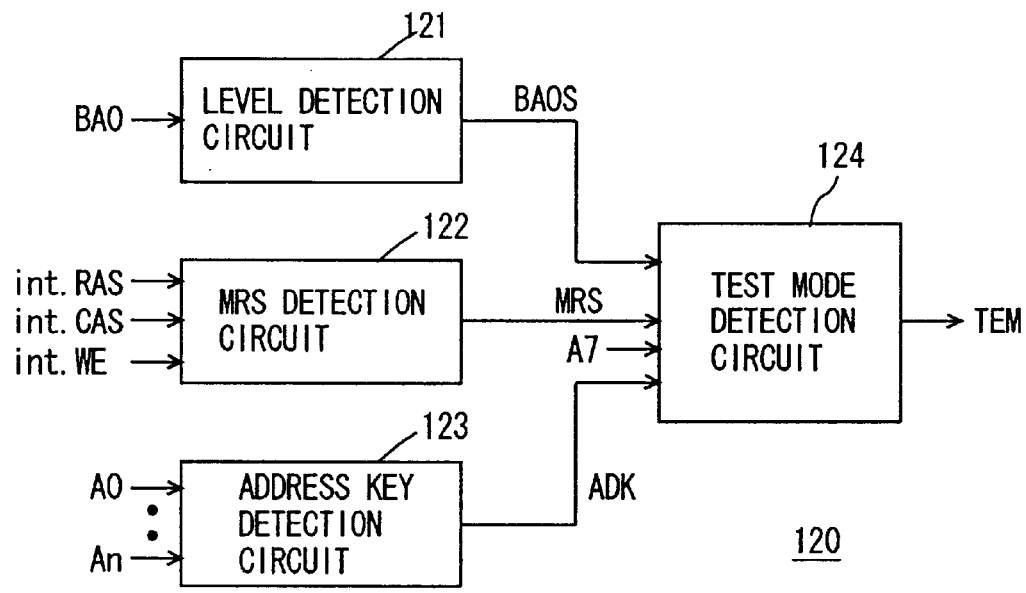
FIG. 9 is a schematic representation of an arrangement of a mode setting circuit shown in FIG. 8.
Figure 10:
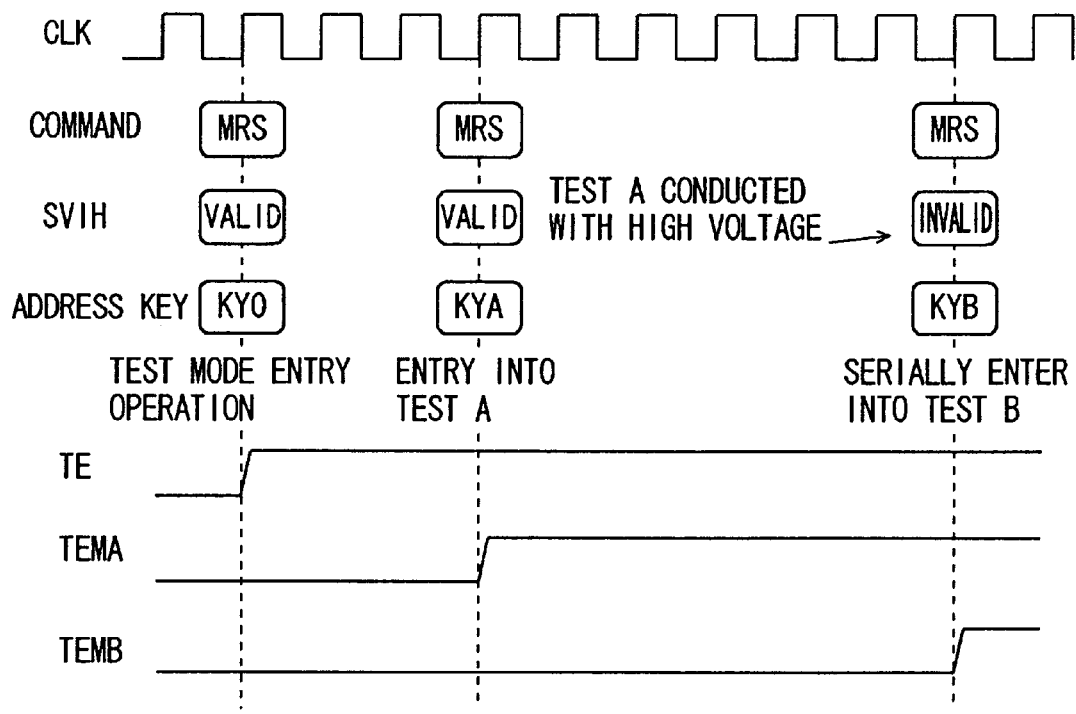
FIG. 10 is a diagram representing an example of a sequence of a conventional serial test entry.
Figure 11:
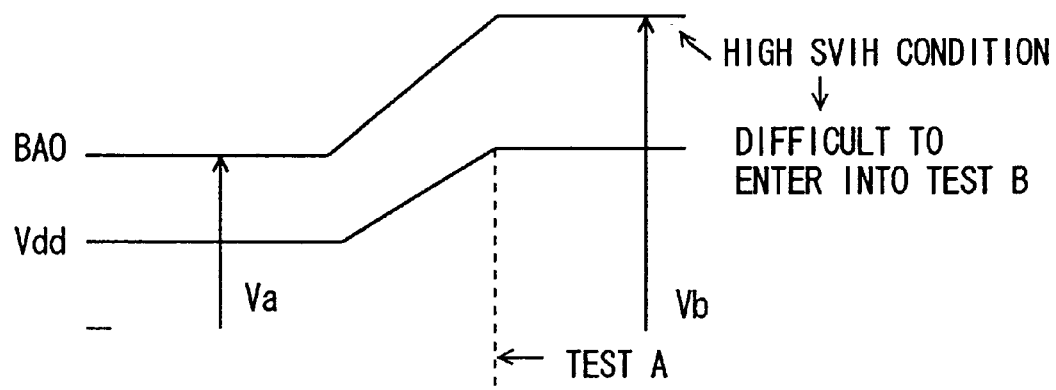
FIG. 11 is a diagram representing an SVIH condition in a conventional serial test entry.

1, a mode detection circuit 124 includes an NAND circuit 2 receiving an SVIH level detection signal BA0S from a level detection circuit 121 shown in FIG. 9, a mode register set command detection signal MRS from an MRS detection circuit 122 shown in FIG. 9, and a specific address signal bit A7; and an NAND circuit 3 receiving an address key detection signal ADK from an address key detection circuit 123 and an output signal from NAND circuit 2 to generate a test mode designating signal TEM. Address key detection circuit 123 includes an NAND circuit 1 for receiving specific predetermined address signal bits of the address signal bits A0 to An other than address signal bit A7. SVIH level detection signal BA0S is set to the H level or the active state when a bank address signal bit BA0 is set to the super VIH condition.

Address key detection circuit 123 is essentially an NAND-type decode circuit, and sets address key detection signal ADK to the L level when predetermined address signal bits of the address signal bits A0 to An are set to prescribed states. NAND circuit 2 outputs an L level signal when SVIH level detection signal BA0S, mode register set command detection signal MRS, and the specific address signal bit A7 are all at the H level. NAND circuit 3 sets test mode designating signal TEM for designating a specific test operation mode to the H level or the active state when output signals from these NAND circuits 1 and 2 both attain the L level.

Conventionally, SVIH level detection signal BA0S has its voltage level uniquely set by an output signal from level detection circuit 121 shown in FIG. 9. The present invention allows SVIH level detection signal BA0S to be forced to the active state. In other words, the present invention allows SVIH level detection signal BA0S to be set to the H level even when a specific signal (bank address signal bit) BA0 is not set to a voltage level that satisfies the super VIH condition (hereinafter referred to as a voltage SVIH). Thus, the super VIH condition can be selectively set to the valid/invalid state according to a test condition, and there is no need to satisfy the super VIH condition under the condition in which an internal voltage is set to a higher voltage. Consequently, the internal voltage need not be changed for the specific test operation mode entry, so that an entry into a specific test mode can be efficiently performed. Moreover, when the internal voltage is not set to a high voltage, the super VIH condition can be required for the entry into a specific test operation mode. A specific circuit arrangement will be described below.

Figure 2:
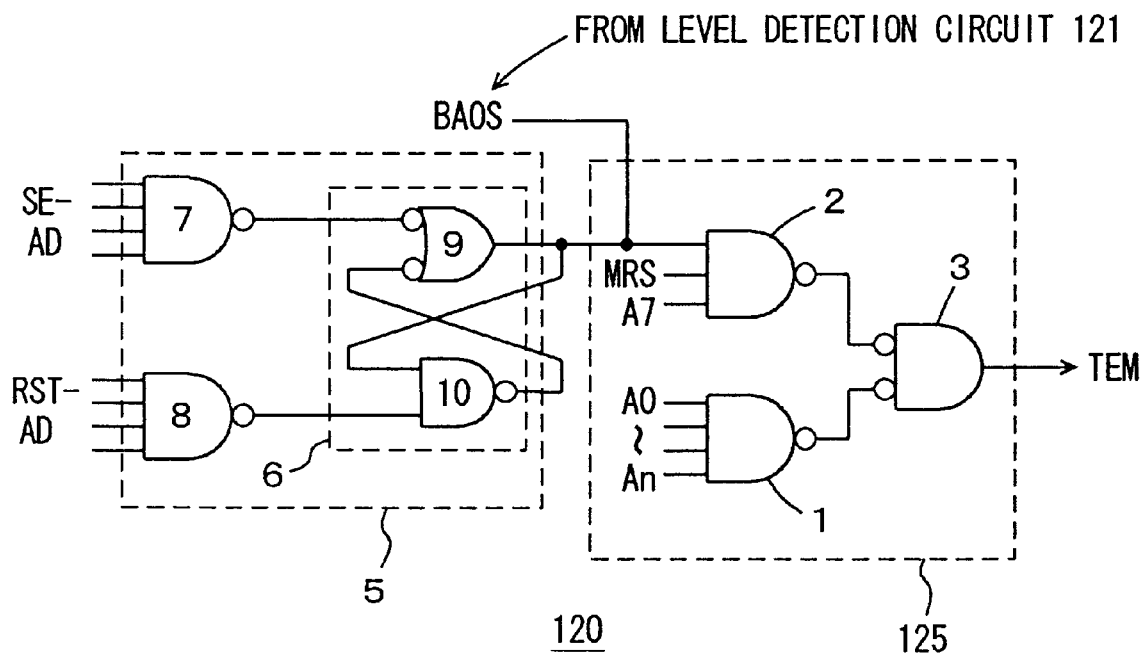
FIG. 2 is a diagram representing an example of an arrangement of a force circuit according to a first embodiment of the present invention.

FIG. 2 is a diagram illustrating an example of an arrangement of a main portion of a mode setting circuit according to the first embodiment of the present invention. Similarly to the arrangement shown in FIG. 1, a test mode control circuit 125 includes an NAND circuit 2 for receiving an SVIH level detection signal BA0S, a mode register set command detection signal MRS, and a specific address signal bit A7; an NAND circuit 1 for receiving prescribed address signal bits A0 to An; and an NOR circuit 3 for receiving output signals from NAND circuits 1 and 2. A force circuit 5 (program circuit) for forcing SVIH level detection signal BA0S to the H level is provided to test mode control circuit 125.

Force circuit 5 includes an NAND circuit 7 for receiving a setting address key signal SEAD, an NAND circuit 8 for receiving a resetting address key signal RSTAD, and a set/reset flip-flop 6 that is set when an output signal from NAND circuit 7 is at the L level and is reset when an output signal from NAND circuit 8 is at the L level. Each of setting address key signal SEAD and resetting address key signal RSTAD includes a control signal and a specific address signal bit. Therefore, the set of mode register set command detection signal MRS and address signal bit A7 and other prescribed address signal bit(s) may be supplied, as an address key signal, to each of these NAND circuits 7 and 8. In order to validate or invalidate the SVIH condition for a specific test operation mode, the timing relationship of specific control signals such as the WCBR condition can be utilized to prevent erroneous entry into a test operation mode.

Set/reset flip-flop 6 includes an NAND circuit 9 for receiving an output signal from NAND circuit 7 at a first input thereof and an NAND circuit 10 for receiving an output signal from NAND circuit 8 at a first input thereof. An output of NAND circuit 9 is wired OR-connected to an output node of level detection circuit 121 shown in FIG. 9. In addition, an output signal from NAND circuit 9 is supplied to a second input of NAND circuit 10 and an output signal from NAND circuit 10 is supplied to a second input of NAND circuit 9.

When set/reset flip-flop 6 is set by setting address key signal SEAD, force circuit 5 invalidates the super VIH condition and forces SVIH level detection signal BA0S to the H level to simulate that the super VIH condition is being satisfied. When resetting address key signal RSTAD is supplied, set/reset flip-flop 6 is reset, the super VIH condition becomes valid, and the voltage level of SVIH level detection signal BA0S is set according to an output signal from level detection circuit 121.

Figure 3:
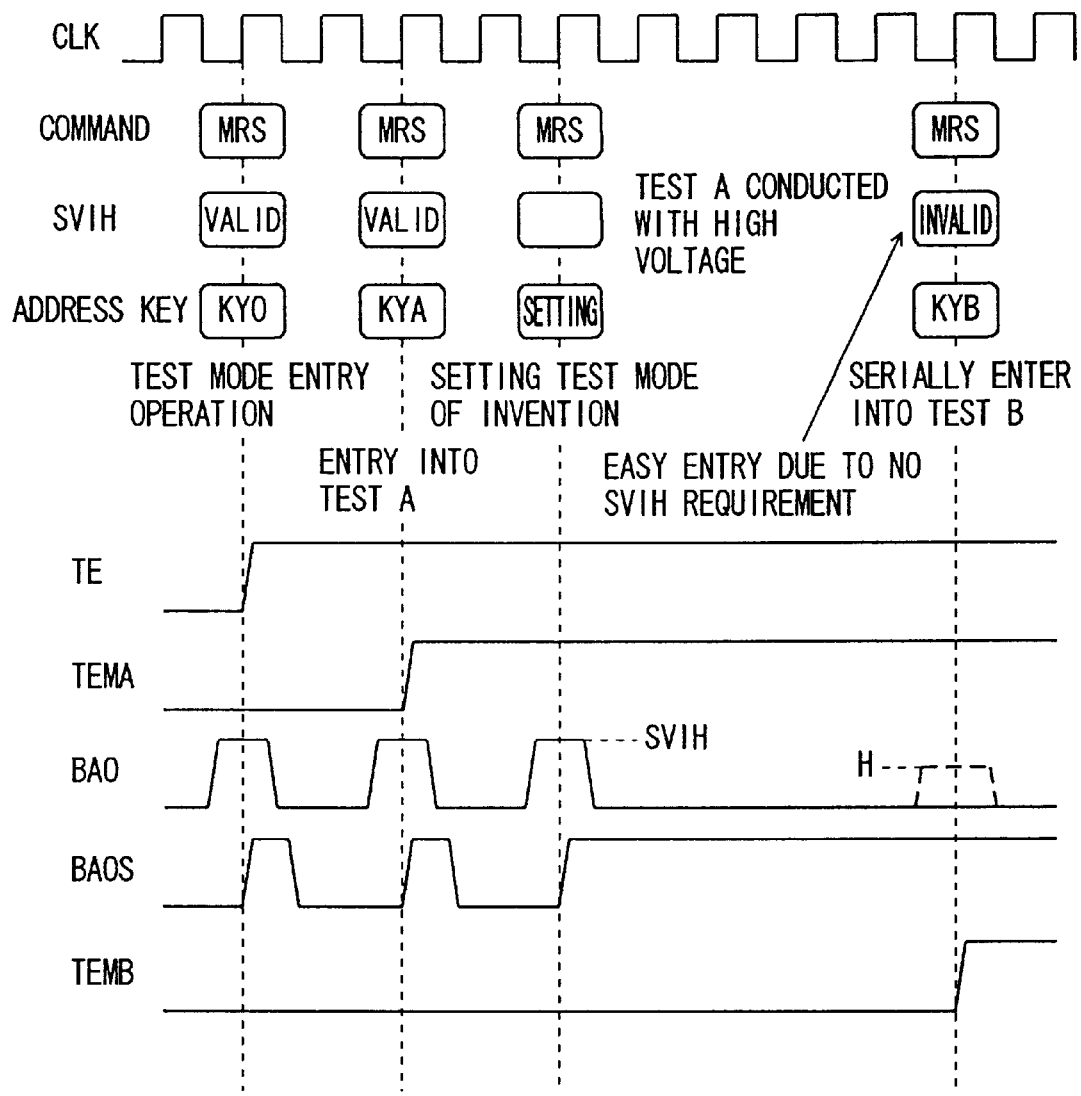
FIG. 3 is a diagram representing a serial test entry sequence in the first embodiment of the present invention.

FIG. 3 is a diagram representing an example of a test mode entry operation sequence according to the first embodiment of the present invention. An operation of mode setting circuit 120 shown in FIG. 2 will now be described with reference to FIG. 3.

First, in order to enter into a test mode in which individual test operations are performed, a mode register set command detection signal MRS including an address signal bit A7 is supplied, a bank address signal BA0 is set to a voltage SVIH level, and an address key for test mode entry KY0 is set. Accordingly, a test mode instruction signal TE is activated, and while test mode instruction signal TE is in the active state, instructions for individual test operation mode can be accepted.

Then, in order to enter into a test operation mode in which a test A is performed, again, mode register set command detection signal MRS including the specific address signal bit A7, bank address signal BA0 of voltage SVIH level, and an address key KYA for designating test A are applied. Consequently, a test instruction signal TEMA from a test mode detection circuit provided for test A attains the active state so that test A can be executed. The super VIH condition is required in the test mode entry operation and the operation of entry into test A, and the SVIH level detection signals BA0S from level detection circuit 121 attains the H level for a prescribed period in each entry operation.

Then, after test A is entered, mode register set command detection signal MRS and a setting address key consisting of specific address signal bits are applied to set the force circuit 5. Mode register set command detection signal MRS and the setting address key correspond to setting address key signal SEAD shown in FIG. 2. Thus, set/reset flip-flop 6 in force circuit 5 is set, and SVIH level detection signal BA0S is set to the H level. The address signal bits included in the setting address key are different in logic states from the address key for designating a specific test mode, and during this operation mode, a specific test mode is not set. When a mode is set in which the super VIH condition is invalidated, the super VIH condition is not particularly required. The super VIH condition is required upon test mode entry, and the programming of validating/invalidating the super VIH condition is allowed while the test mode entry is being performed. Thus, there is substantially no possibility of an erroneous operation occurring in a normal operation.

Since SVIH level detection signal BA0S is forced to the H level or the active level, in the case where a test B is to be entered thereafter, a test instruction signal TEMB for enabling test B is activated by supplying mode register set command detection signal MRS and a specific address key KYB (address signal bits A0 to An). Thus, when a high voltage is internally generated and the internal operation is performed under such high voltage condition in test A, if test B is to be entered thereafter, test B can be readily entered into without requiring the super VIH condition. Test B is a test mode that is executed after test mode instruction signal TE is driven to the active state. The super VIH condition must be satisfied in order to activate test mode instruction signal TE. Thus, even when entry into test B is allowed without the super VIH condition, the transition into the operation mode that designates test B is prevented on the user side, since the super VIH condition is required to activate test mode instruction signal TE.

In particular, for entry into test A to perform a test under a high voltage condition, the super VIH condition is required again, and therefore erroneous entry into test A during a normal operation on the user side and the resultant generation of unnecessary high voltage can be prevented reliably In addition, while test A and test B are executed, test instruction signals TEMA and TEMB are held in their respective active states. Circuits are provided for latching signals for activating individual test operation modes from test control circuit 125 shown in FIG. 2, and these test instruction signals TEMA and TEMB are held in the active state by the latching circuits while the individual tests are performed. An appropriate latch circuit such as a flip-flop can be used as the circuit for maintaining a test instruction signal to an active or inactive state.

In an avoidable case from the viewpoint of constraints of a test apparatus such as the incapability to change an internal voltage at a high speed or the difficulty to generate a sufficiently high voltage and the viewpoint of test efficiency such as changing the voltage level of the internal voltage, force circuit 5 is utilized to invalidate the super VIH condition effectively for entry into a test operation mode. Thus, entry into a desired test operation mode can be easily implemented to execute a test efficiently, while an erroneous entry into the test mode on the user side is prevented.

Figure 4:
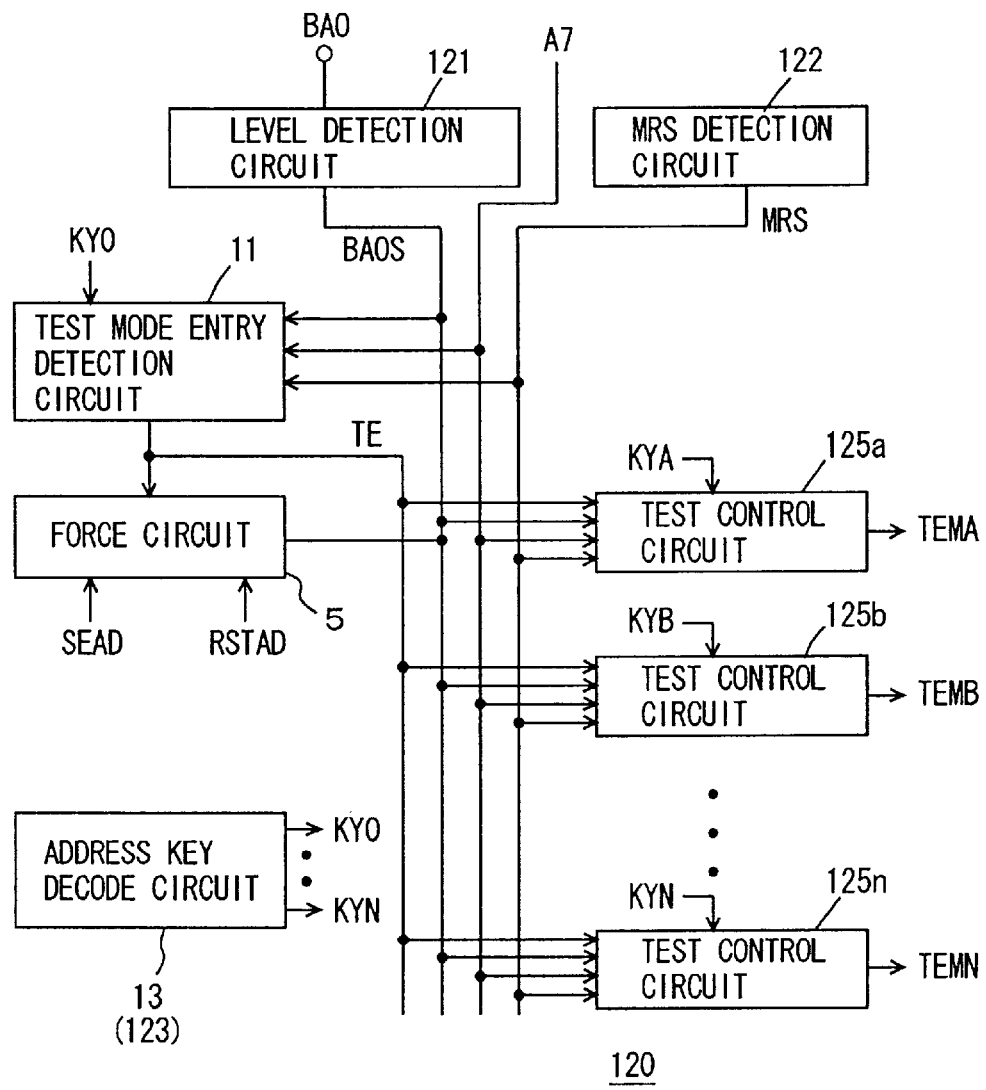
FIG. 4 is a schematic representation of an arrangement of a portion related to a test entry of a test control circuit according to the first embodiment of the present invention.

FIG. 4 is a schematic representation of an arrangement of a portion related to a test mode entry of mode setting circuit 120 according to the first embodiment of the present invention. In FIG. 4, mode setting circuit 120 includes test control circuits 125a to 125n provided corresponding to respective tests A to N for activating test instruction signals TEMA to TEMN, each for activating a corresponding test when activated. These test control circuits 125a to 125n receive an address signal bit A7, an SVIH level detection signal BA0S from level detection circuit 121, a mode register set command detection signal MRS from MRS detection circuit 122, and corresponding address keys KY0 to KYN from an address key decode circuit 13.

In addition, a test mode entry detection circuit 11 is provided for performing a test operation. Test mode entry detection circuit 11 receives SVIH level detection signal BA0S from level detection circuit 121, mode register set command detection signal MRS from MRS detection circuit 122, a specific address signal bit A7, and a specific address key KY0. Test mode entry detection circuit 11 activates a test mode instruction signal TE when a mode register set command and a prescribed address key are supplied. Test control circuits 125a to 125n are set to a state in which they can accept a test operation mode instruction signal when test mode instruction signal TE from test mode entry detection circuit 11 is in the active state.

An output of force circuit 5 is wired OR-connected to an output of level detection circuit 121. Force circuit 5 receives a setting address key signal SEAD when test mode instruction signal TE from test mode entry detection circuit 11 attains the active state. In force circuit 5, NAND circuit 7 in the arrangement shown in FIG. 2 receives test mode instruction signal TE. For force circuit 5, test mode instruction signal TE may be applied to a resetting NAND circuit 8 as well.

Address key decode circuit 13 includes address key detection circuits 123 shown in FIG. 1, provided corresponding to the respective tests, and activates an address key detection signal for designating a corresponding test when the supplied address key satisfy a respective prescribed condition.

As shown in FIG. 4, force circuit 5 accepts setting address key signal (including a control signal and an address signal bit) SEAD after test mode instruction signal TE is activated by test mode entry detection circuit 11. Test mode entry detection circuit 11 activates test mode instruction signal TE according to the specific address signal bit A7, mode register set command detection signal MRS, and an address key KY0 when SVIH level detection signal BA0S from level detection circuit 121 is activated. Thus, for a test mode entry, the super VIH condition must be satisfied so that an erroneous entry into a test mode on the user side can be prevented reliably.

In tests A to N in which test control circuits 125a to 125n are activated, respectively, force circuit 5 is set so as to force SVIH level detection signal BA0S to the active state before the super VIH condition is satisfied when test efficiency would be degraded, or when the super VIH condition cannot be satisfied by application of a high voltage due to the constraints of the test apparatus, or when an internal voltage cannot be changed at a high speed. Thus, a plurality of test operation modes are serially entered into to allow complex testing. Thus, a plurality of tests can be performed with accuracy in one test mode, while no application of high voltages is required and therefore, destruction of a semiconductor integrated circuit device under test in a test can be prevented.

Modification

Figure 5:
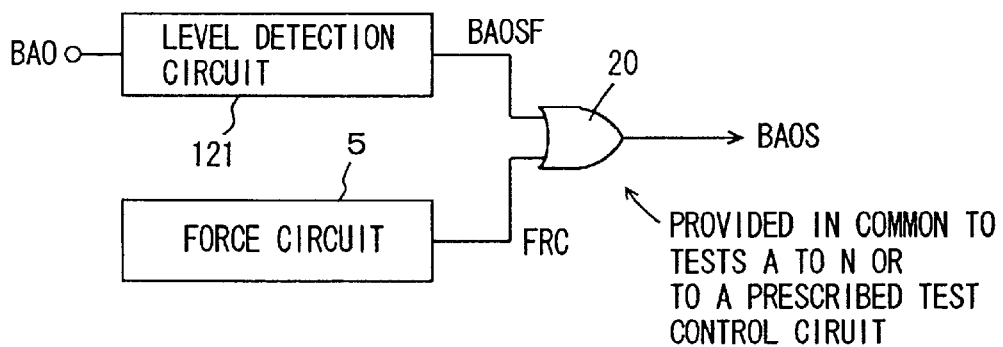
FIG. 5 is a diagram representing an arrangement of a modification to the first embodiment of the present invention.

FIG. 5 is a schematic representation of an arrangement of a modification to the first embodiment of the present invention. As shown in FIG. 5, a SVIH level detection signal BA0S is generated by an OR circuit 20 that receives an output signal BA0SF from a level detection circuit 121 and an output signal FRC from a force circuit 5. The arrangement of force circuit 5 is the same as that shown in FIG. 2. OR circuit 20 may be provided in common to tests A to N, or in common to test control circuits 125a to 125n shown in FIG. 4, or it may be provided for each set of a prescribed number of tests of these tests A to N, that is, for each prescribed test control circuits.

In the arrangement shown in FIG. 5, OR circuit 20 is employed in place of the wired OR connection. Thus, the valid state/invalid state of output signal BA0S from the level detection circuit can be set accurately according to SVIH level detection signal BA0S and output signal FRC from a force circuit 5. Here, an "invalid state" is a state in which SVIH level detection signal BA0S is set to the H level regardless of the logic level of output signal BA0S from level detection circuit 121, and a "valid state" is a state in which the logic level of SVIH level detection signal BA0S is set according to output signal BA0S from level detection circuit 121.

Moreover, when the OR circuit is provided for each prescribed test control circuits of test control circuits 125a to 125n shown in FIG. 4, the super VIH condition requirement can be dispensed with only for a test executed after an internal voltage is set to a high voltage. Therefore, when compared with an arrangement in which presence/absence of the super VIH condition requirement is set for individual tests by setting/resetting of force circuit 5, tests which require a super VIH condition and tests which virtually establish the super VIH condition can be grouped more easily. In addition, for a test requiring high voltage application, by directly applying output signal BA0S from level detection circuit 121 to a corresponding test control circuit so as to require the super VIH condition at all times, an entry into an actual high voltage application test mode in the actual use by the user can be prevented even if test mode instruction signal TE is activated.

As described above, according to the first embodiment of the present invention, the logic level of an SVIH level detection signal is made programmable with a force circuit, or can be set selectively. Thus, a desired test operation mode can be entered easily without degrading test efficiency, and the test time can be shortened. Moreover, the virtually invalidation of super VIH condition is made programmable only for individual tests after test mode entry so that an erroneous entry into a test mode during the actual use on the user side can reliably prevented.

Second Embodiment

Figure 6:
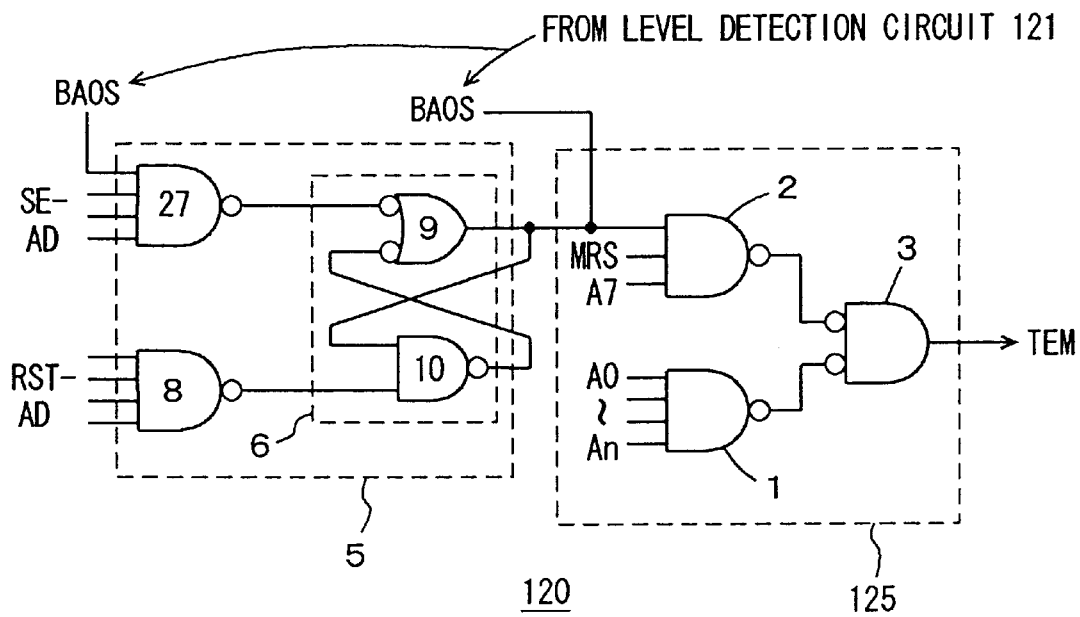
FIG. 6 is a diagram illustrating an example of an arrangement of a force circuit according to a second embodiment of the present invention.

FIG. 6 is a diagram showing an arrangement of a mode setting circuit 120 according to the second embodiment of the present invention. In force circuit 5 in the arrangement shown in FIG. 6, an SVIH level detection signal BA0S from a level detection circuit 121 is provided, in addition to a setting address key signal SEAD, to an NAND circuit 27 for setting a set/reset flip-flop 6. The arrangement in other parts is the same as that shown in FIG. 2, and the corresponding parts are denoted with the same reference characters and the detailed descriptions thereof will not be repeated.

Figure 7:
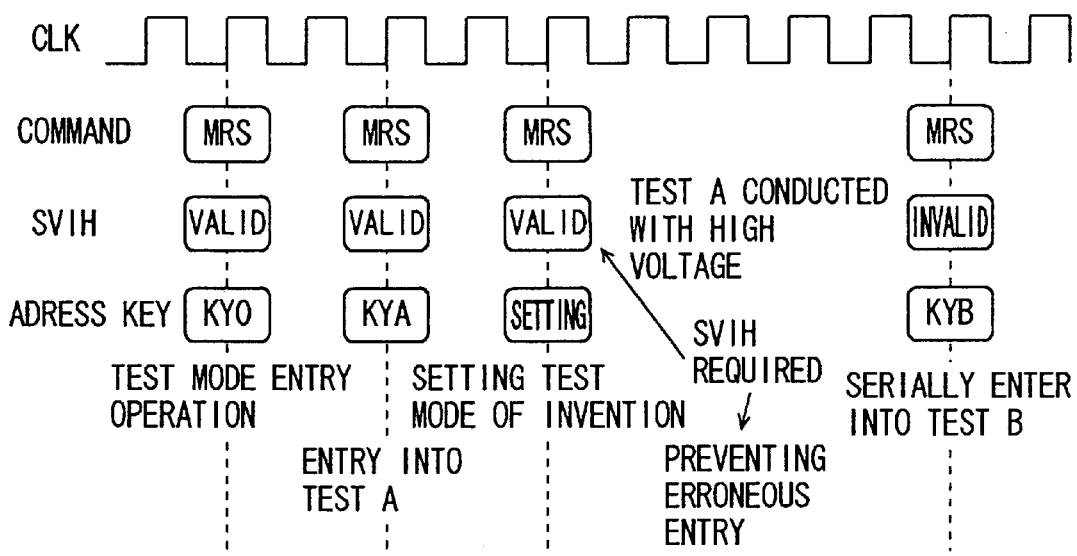
FIG. 7 is a diagram representing an example of a sequence of serial test entry in the second embodiment of the present invention.
Figure 8:
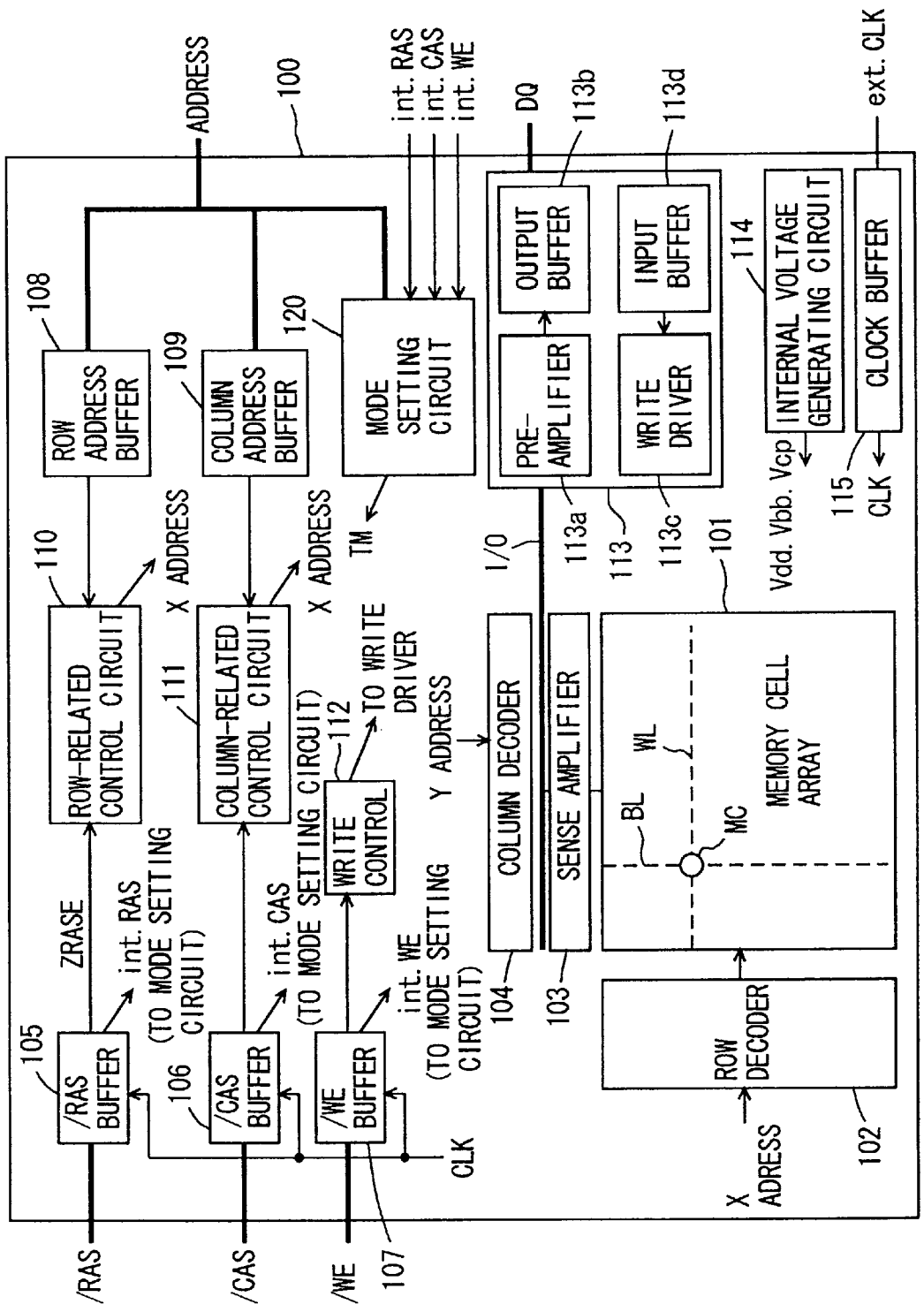
FIG. 8 is a schematic representation of an overall arrangement of a conventional DRAM.

In the arrangement shown in FIG. 6, the super VIH condition is required in order to driving set/reset flip-flop 6 to a set state. In other words, in the test sequence shown in FIG. 7, after entering into test A that requires a high voltage, the super VIH condition is required in a program mode for virtually holding the super VIH condition. Thus, an erroneous entry into this program mode for virtually establishing the super VIH condition can be prevented. After set/reset flip-flop 6 is set in force circuit 5, other individual test operation modes requiring the super VIH condition can be entered into even when the super VIH condition is not held. Thus, in addition to the effect achieved by the first embodiment, an erroneous entry into a program mode in which a super VIH condition is virtually set can be prevented reliably, and a test can be performed with accuracy.

Moreover, also in the arrangement of the second embodiment shown in FIG. 6, an OR circuit for ORing an output signal from set/reset flip-flop 6 and an output signal from level detection circuit 121 may be used.

In addition, an output signal from set/reset flip-flop 6 may be, without OR-coupling to an output of level detection circuit 121, directly used in place of an output signal from level detection circuit 121. Specifically, an output signal from set/reset flip-flop 6 is supplied, as an SVIH level detection signal, to a prescribed test control circuit among test control circuits 125a to 125n shown in FIG. 4, and an SVIH level detection signal BA0S from level detection circuit 121 is applied to test control circuits provided upstream the prescribed test control circuit. As a result, it becomes possible to set, without the super VIH condition, prescribed test operation modes among the test modes that are serially set upon test mode entry. The super VIH condition is required upon entry into a test mode and upon entry into an initial specific test (requiring a high voltage) operation mode.

Example of Application

In the above description, a clock synchronous DRAM is indicated as an example of a semiconductor integrated circuit device. The present invention, however, is applicable to any semiconductor integrated circuit device that requires the super VIH condition upon entry into an individual test operation mode. In addition, a bank address signal bit BA0 is used for setting of the super VIH condition upon the test (operating) mode entry. A signal that is set to the super VIH condition, however, may be any specific signal, and is not limited to bank address signal bit BA0.

Moreover, upon the test (operating) mode entry, mode register set command MRS and a specific address key are supplied, and further, a specific address signal bit A7 is utilized. An operation mode instruction signal for the test (operating) mode entry may be any combination of signals specifying a test mode instruction and a test content, and a signal used for test mode instruction is not particularly limited to mode register set command MRS and address signal bit A7, and any other signal may be employed test mode instruction.

As described above, according to the present invention, the super VIH condition (specific voltage condition) can be programmed to a valid/invalid state upon individual test entry in a test mode. Thus, a test operation mode can be entered efficiently while suppressing the possibility of an erroneous entry into a test mode during the actual use on the user side. In addition, the test time can be reduced, which accordingly reduces the cost of the semiconductor integrated circuit device.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:
   mode detection circuitry for activating a specific mode instruction signal when a voltage of a specific node is at a first voltage;
   control signal generating circuitry for generating a control signal for activating an operation designated by an operation mode instruction signal in response to an output signal from said mode detection circuitry and said operation mode instruction signal; and
   force circuitry for forcing said specific mode instruction signal to either one of an activated state and an inactivated state independently of a level of the voltage of said specific node.

2. The semiconductor device according to claim 1, wherein
said force circuitry includes a circuit coupled to an output of said mode detection circuitry for setting said specific mode instruction signal to an active state in response to a set of predetermined first signal(s).

3. The semiconductor device according to claim 2, wherein
said force circuitry includes a circuit coupled to an output of said mode detection circuitry for inactivating said specific mode instruction signal in response to a set of predetermined second signal(s).

4. The semiconductor device according to claim 1, wherein
said force circuitry includes a circuit for setting said specific mode instruction signal to an active state for application to said control signal generating circuitry in response to a set of predetermined first signal(s) including an output signal from said mode detection circuitry.

5. The semiconductor device according to claim 4, wherein
said force circuitry further includes a circuit for setting said specific mode instruction signal to an inactive state in response to a set of predetermined second signal(s).

6. The semiconductor device according to claim 1, further comprising:
main mode detection circuitry for enabling said force circuit and said control signal generating circuit in response to at least activation of said specific mode instruction signal.

7. The semiconductor device according to claim 1, wherein
said first voltage is a voltage higher than a voltage applied to said specific node during a normal operation mode.

8. A semiconductor device operable in a plurality of test modes, comprising:
test mode detection circuitry for generating an internal signal for designating a test mode designated by a test mode instruction signal applied externally when a voltage of a specific node is at least at a prescribed voltage level; and
test condition setting circuitry for selectively setting a voltage condition of said specific node to either of a valid state and an invalid state for said plurality of test modes.

9. The semiconductor device according to claim 8, wherein
said test condition setting circuitry includes condition program circuits provided corresponding to said plurality of test modes, for forcing a state in which said specific node is set to at least said prescribed voltage level in response to a condition setting signal.

10. The semiconductor device according to claim 8, wherein
said test mode detection circuitry includes a level detection circuit for determining whether said specific node is set at least to said prescribed voltage level, and
said test condition setting circuitry includes a circuit for forcing an output signal from said level detection circuit, in accordance with a condition setting signal, to a state of detecting that the voltage at said specific node is at least at the prescribed voltage level.

11. The semiconductor device according to claim 8, wherein
said test condition setting circuitry includes a circuit for setting a voltage level of said specific node for said plurality of test modes to either of a valid state and an invalid state in response to a test condition setting signal including at least a signal of a potential level that is at least at said prescribed voltage.

12. The semiconductor device according to claim 8, wherein
said test mode detection circuitry includes a level detection circuit for detecting whether said specific node is at least at said prescribed voltage level, and
said test condition setting circuitry includes a circuit for receiving an output signal from said level detection circuit and a prescribed signal as said condition setting signal, to set the voltage condition of said specific node for the respective test modes to either of a valid state and an invalid state.

13. The semiconductor device according to claim 8, wherein
said plurality of test modes are serially set in a test mode operation, and said test condition setting circuitry selectively sets the voltage condition of said specific node to either of a valid state and an invalid state for setting conditions of the test modes set serially.

14. The semiconductor device according to claim 8, wherein
said test condition setting circuitry includes a program circuit provided in common for predetermined test modes among said plurality of test modes, for setting said voltage condition of the specific node commonly for said predetermined test modes to either of a valid state and an invalid state.

15. The semiconductor device according to claim 8, wherein said test mode detection circuitry is configured to generate the internal signal independent of the voltage of the specific node when the voltage condition is set to the invalid state.

* * * * *

UNITED STATES PATENT AND TRADEMARK OFFICE
CERTIFICATE OF CORRECTION

PATENT NO.    : 6,651,022 B2
DATED         : November 18, 2003
INVENTOR(S)   : Shunsuke Endo It is certified that error appears in the above-identified patent and that said Letters Patent is hereby corrected as shown below:

<u>Title page,</u>
Item [73] Assignee, should read -- Renesas Technology Corp --.

Signed and Sealed this

Fifteenth Day of June, 2004

JON W. DUDAS
*Acting Director of the United States Patent and Trademark Office*